United States Patent [19]
Powell et al.

[11] Patent Number: 6,047,159
[45] Date of Patent: Apr. 4, 2000

[54] RECONFIGURABLE NODE FOR A COMMUNICATIONS NETWORK

[75] Inventors: Eric G. Powell, Buford; Catherine W. Jelinek, Lawrenceville; Michael J. Labiche, Alpharetta; Mark A. Palazzo, Grayson; Stephan W. Vogt, Lawrenceville, all of Ga.

[73] Assignee: Scientific-Atlanta, Inc., Norcross, Ga.

[21] Appl. No.: 09/102,026

[22] Filed: Jun. 22, 1998

Related U.S. Application Data

[63] Continuation-in-part of application No. 08/657,205, Jun. 3, 1996, abandoned.

[51] Int. Cl.[7] .............................. H04N 1/00; H04N 7/10; H04B 10/00; H04B 10/02
[52] U.S. Cl. ................... 455/3.1; 455/5.1; 348/6; 359/152; 359/163; 359/174; 359/176
[58] Field of Search ....................... 359/113, 115, 359/152, 154, 163, 171, 174, 176; 370/276, 293; 455/3.1, 3.3, 5.1; 348/6, 10

[56] References Cited

U.S. PATENT DOCUMENTS

| | | |
|---|---|---|
| 3,566,046 | 2/1971 | McCormick et al. .................. 179/170 |
| 4,680,809 | 7/1987 | Hartkopf et al. . |
| 4,805,234 | 2/1989 | Husbands . |
| 4,812,779 | 3/1989 | Wagner .................................... 330/149 |
| 5,262,883 | 11/1993 | Pidgeon . |
| 5,315,424 | 5/1994 | Boden et al. . |
| 5,390,038 | 2/1995 | Cecchini . |
| 5,390,337 | 2/1995 | Jelinek et al. ........................... 455/5.1 |
| 5,434,610 | 7/1995 | Loveless . |
| 5,442,472 | 8/1995 | Skrobko . |
| 5,488,413 | 1/1996 | Elder et al. . |
| 5,505,901 | 4/1996 | Harney et al. . |
| 5,581,555 | 12/1996 | Dubberly et al. ....................... 370/487 |
| 5,606,725 | 2/1997 | Hart . |
| 5,694,232 | 12/1997 | Parsay et al. . |
| 5,898,454 | 4/1999 | Brickell ....................................... 348/6 |

*Primary Examiner*—Douglas W. Olms
*Assistant Examiner*—David R Vincent
*Attorney, Agent, or Firm*—Kenneth M. Massaroni; Kelly A. Gardner; Hubert J. Barnhardt III

[57] ABSTRACT

A node (100) for a communications system includes a forward distribution amplifier within a housing (600). Plug-in modules (200,400) can be removably attached to the forward distribution amplifier within the same housing (600) to change the functionality of the node (100). For example, the plug-in module can be a reverse amplifier module (200) for adding reverse signal processing function or an optical module (400) for adding optical capabilities.

19 Claims, 9 Drawing Sheets

RECONFIGURABLE NODE FOR A COMMUNICATIONS NETWORK

CROSS-REFERENCE TO RELATED APPLICATIONS

This application is a continuation-in-part of U.S. application Ser. No. 08/657,205, Palazzo et al., filed Jun. 3, 1996 entitled "Reconfigurable Node for a Communications Network", now abandoned.

FIELD OF THE INVENTION

The present invention generally relates to a node for a communications network and, more particularly, to a reconfigurable node for a communications network which is adapted to be reconfigured using a plug-in module.

BACKGROUND OF THE INVENTION

In the past, broadband coaxial community area or cable television (CATV) systems have been designed with a system architecture known as "trunk and feeder." The function of a trunk coaxial cable is to deliver broadband television signals from a reception center, or headend, over the shortest distance with the least amount of amplification to a plurality of distribution points. The distribution points are connected to feeder coaxial cables which emanate from the trunk coaxial cable and contain subscriber tap off devices. Over long stretches of coaxial distribution runs, the broadband television signals are amplified at spaced locations by distribution amplifiers. The broadband television signals are transmitted over the distribution network from the headend in a forward direction to a plurality of subscribers, which is generally termed a one-way system. However, more complex systems include a reverse signal path. The reverse channel is used for system control, messaging, pay-per-view events, monitoring, and the like.

In recent years, there has been a great deal of interest in the transmission of various types of information including, for example, broadband television signals, via optical fibers. Optical fibers intrinsically have more information carrying capacity than do the coaxial cables which are used in present CATV systems. In addition, optical fibers are subject to less signal attenuation per unit length than are coaxial cables adapted for carrying radio frequency signals. Consequently optical fibers are capable of spanning longer distances between signal regenerators or amplifiers than are coaxial cables. In addition, the dielectric nature of optical fiber eliminates the possibility of signal outages caused by electrical shorting or radio frequency pick-up. Finally, optical fiber is immune to ambient electromagnetic interference ("EMI") and generates no EMI of its own.

In view of these advantages of optical fibers, attempts are being made to push optical fiber deeper and deeper into the distribution system, i.e., closer to the homes (subscribers) in the system. However, such attempts require that current distribution equipment be changed in order to accommodate the optical fiber. Such changes can result in significant higher infrastructure costs. In some instances, the distribution equipment can be upgraded to accommodate fiber. For example, a system distribution amplifier model 6920 (available from Scientific-Atlanta, Inc. of Norcross, Ga.) is capable of being upgraded to include a fiber receiver. However, in order to implement such an upgrade, all of the electronics must be removed from the housing and new electronics must then be installed. In addition, a different amplifier housing cover must be provided. Thus, such upgrades result in considerable equipment and labor costs. Accordingly, it would be desirable to provide a simple method and apparatus which permits a simple and inexpensive upgrade of subscriber television systems and, in particular, which permits a simple and inexpensive migration of current coaxial systems to fiber optic systems.

DETAILED DESCRIPTION OF A PREFERRED EMBODIMENT

The node of the present invention will be described below in terms of a distribution amplifier usable in a distribution system of a broadband communications network. However, the present invention is not limited in this respect and the principles set forth herein are generally applicable to any node in a communication network including by way of example, but not by way of limitation, system amplifiers, line extenders, taps, and nodes functioning as electrical repeaters and signal regenerators.

Figure 1:
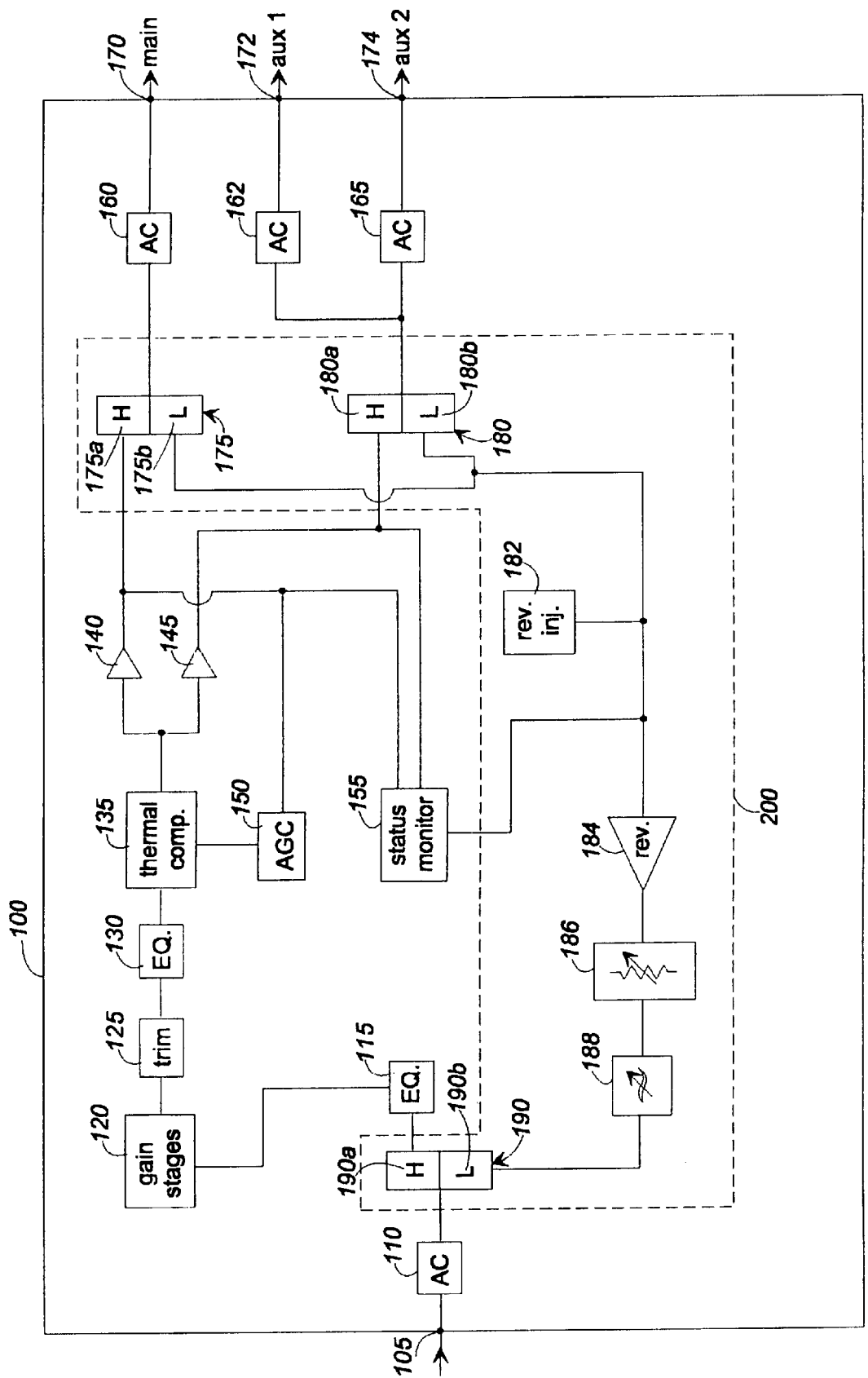
FIG. 1 is a block diagram of a node for a communications network in accordance with a first embodiment of the present invention.

In FIG. 1, there is shown a node 100 having a plug-in module 200 for use in a two-way broadband communications network. As configured in FIG. 1, node 100, without the plug-in module 200, comprises a forward distribution amplifier for use in a cable television system. The forward distribution amplifier can, with jumpers (not shown) between alternating current (AC) circuitry 110 and equalizer 115 and between gain stages 140, 145 and AC circuitry 160, 162, 165, respectively, operate as a stand-alone unit without any plug-in module at all. However, a variety of different plug-in modules can be inserted, as shown by the dashed lines, to enhance and even change the functionality of the node 100.

As depicted in FIG. 1, the node 100 includes the forward distribution amplifier with, as a part of the plug-in module 200, a reverse amplifier. In accordance with the present invention, the components of plug-in module 200 are provided on a first circuit board and the remaining components are provided on a motherboard or some other circuit boards. Plug-in module 200 is adapted to be removably attached to at least one of the motherboard or the other circuit boards. Node 100 further includes an environmental housing for protecting the circuit boards.

Node 100 includes first gain stages 120 and second stage forward path signal amplifiers 140, 145. These amplifiers function to amplify forward path signals supplied to a port 105 that is accessible from an exterior of the node housing. Plug-in module 200 of node 100 includes a reverse path signal amplifier 184 for amplifying reverse path signals supplied to the node as described below. Plug-in module 200 further includes diplex filters 175, 180, 190. Specifically, to allow the forward path signals and the reverse path signals to use the same coaxial cable without interference, a diplex filter 190 is provided on the input side of the forward path signal amplifiers and the output side of the reverse path signal amplifier, and diplex filters 175, 180 are provided on the output side of the forward path signal amplifiers and the input side of the reverse path signal amplifier.

Figure 2:
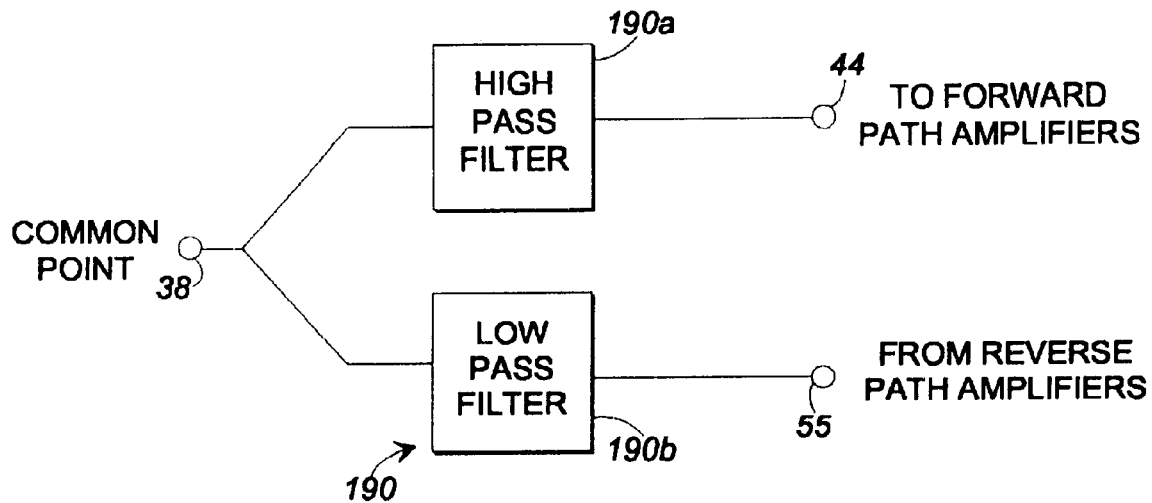
FIG. 2 is a general block diagram of a diplex filter.

Each diplex filter 175, 180, 190 is a three-port passive device having a high-pass filter and a low pass filter joined at a common point. For example, FIG. 2 generally illustrates diplex filter 190 which includes a high pass filter 190a and a low pass filter 190b connected at a common point 38. A terminal 44 of high pass filter 190a is coupled to the forward path signal amplifiers and a terminal 55 of the low pass filter 190b is coupled to the reverse path signal amplifier. Additional details of diplex filters are set forth, for example, in U.S. Pat. No. 5,390,337, which is incorporated herein by reference.

In the configuration of FIG. 1, the diplex filters 175, 180, 190 separate the forward path high frequency broadband signals (e.g., television channels from a cable system headend device) and the reverse path low frequency signals (e.g., data or monitoring channels from subscriber equipment). The forward input to diplex filter 190 is supplied from the coaxial input port 105 to the high pass filter 190a via the AC circuitry 110. The output of the high pass filter 190a of diplex filter 190 is supplied to gain stages 120 via circuitry 115 for setting the signal level and providing frequency compensation of the forward signal. A trim circuit 125, an additional equalizer circuit 130, and thermal compensation circuitry 135 can also process the amplified forward signal for transmission to forward amplifiers 140, 145 and, if desired, an automatic gain control (AGC) circuit 150.

A suitable thermal compensation circuit for use in node 100 is described in a commonly assigned application entitled "Thermal Compensation Circuit" (Attorney Docket No. 1263.56288), filed on an even date herewith and incorporated herein by reference. A suitable automatic gain control circuit suitable for use in node 100 is described in a commonly assigned application entitled "Method and Apparatus for Dynamic Automatic Gain Control When Pilot Signal is Lost" (Attorney Docket No. 1263.56285), filed on May 31, 1996, and incorporated herein by reference.

The output of the next stage forward amplifier 140 is supplied to high pass filter 175a of diplex filter 175 and, when such circuitry is present, to the AGC circuit 150 and any status monitoring circuitry 155, which could be, for instance, the status monitor described in a provisional application entitled "Apparatus for Automatic Sensing of Product Configuration for Status Monitoring" (Attorney Docket No. 1263.56372), filed on an even date herewith and incorporated by herein by reference. The output of next stage amplifier 145 is supplied to high pass filter 180a of diplex filter 180 and to any status monitoring circuitry 155. From the high pass filters 175a, 180a, the amplified forward signals are transmitted, via AC circuitry 160, 162, 165, to distribution system output ports 170, 172, 174, thereby providing main and auxiliary forward electrical signal outputs.

The AC circuits 110, 160, 162, 165 are used to decouple AC from the RF frequencies at the input 105 and outputs 170, 172, 174. The AC circuits filter off the AC signal which is then fed to the amplifier power supply (not shown), where a DC supply voltage for the amplifier is generated from the incoming AC waveform. The AC can be input from any port and can be passed to any port.

It will be appreciated that the forward distribution amplifier described above could include additional elements or fewer elements. For instance, additional trim circuits, equalizer circuits, and matching circuitry could be provided. Also, a single second stage amplifier could be provided to generate a single forward electrical RF output, or more than two second stage amplifiers could be provided. As mentioned, AGC circuitry 150 and status monitoring circuitry 155, as well as many other elements of the forward distribution amplifier, are optional.

As shown in FIG. 1, the plug-in module 200 comprises, in this example, a reverse amplifier circuit to add reverse signal processing capabilities to the node 100. Reverse path RF signals can be received at any or all of the coaxial outputs 170, 172, 174 and supplied, via the AC circuitry 160, 162, 165 to diplex filters 175, 180. More specifically, reverse path electrical signals from the distribution system are supplied to reverse path signal amplifier 184 via low pass filter 175b of diplex filter 175 and low pass filter 180b of diplex filter 180. Any reverse path signals locally injected at injection point 182, as well as signals from the status monitor 155, are also supplied to reverse path amplifier 184. The output of reverse path signal amplifier 184 is supplied to low pass filter 190b of diplex filter 190 via an adjustable pad circuit 186 and an adjustable slope circuit 188. Test pads can also be provided at various locations of the reverse amplifier system and the forward amplifier system to test electrical signals.

Since plug-in module 200 is adapted to be removably attached to at least one of the other circuit boards, the functionality of node 100 is easily reconfigured. In addition, when a plug-in module 200 is replaced, the environmental housing of the node may be left in its original location, thereby saving costs which would be associated with replacement and/or physical relocation. In addition, the plug-in modules may be designed so as to fit within the space of existing environmental housings so as not require replacement of the housing or components thereof (e.g., housing covers).

Figure 3:
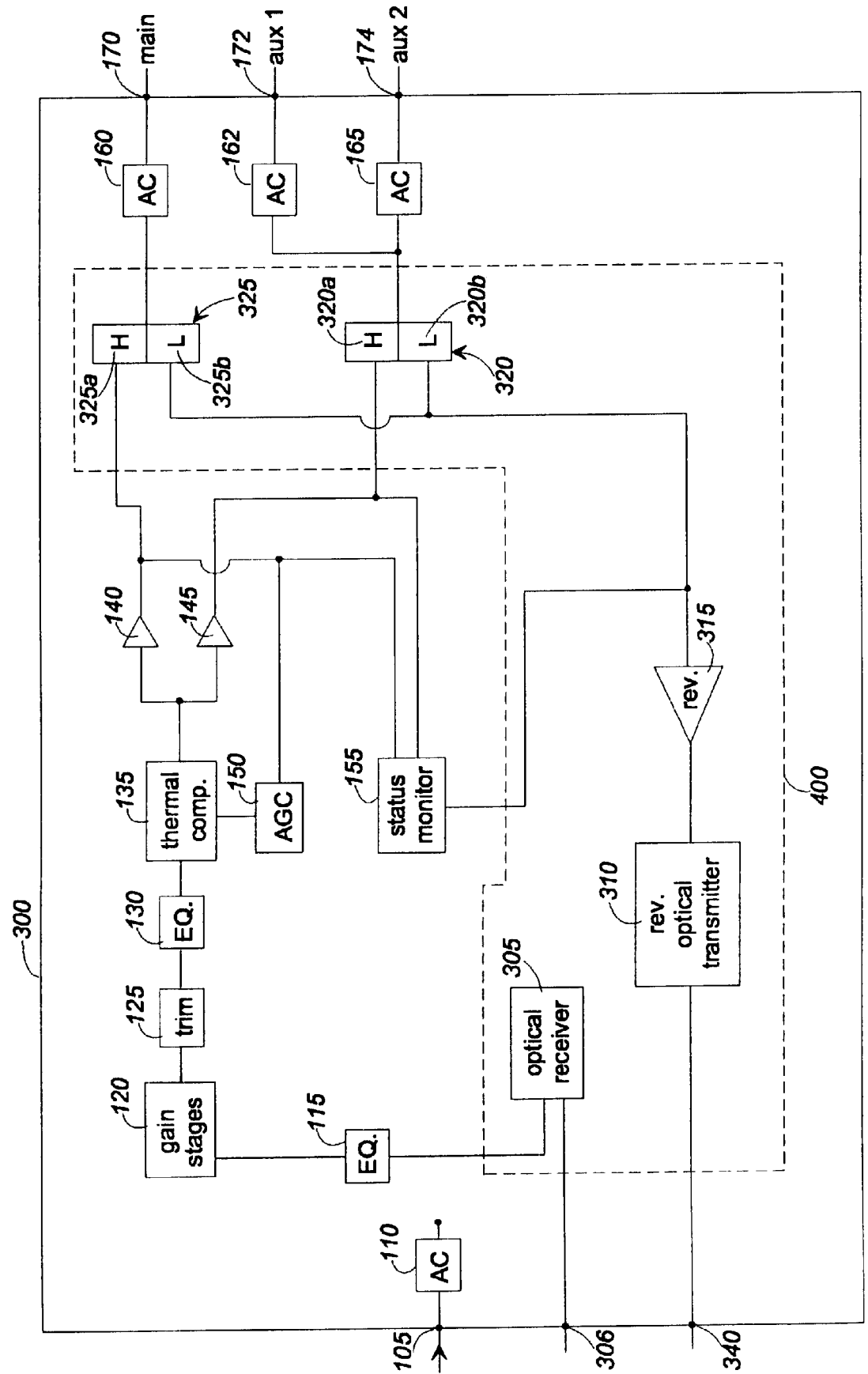
FIG. 3 is a block diagram of a node for a communications network in accordance with a second embodiment of the present invention.

FIG. 3 illustrates a node 300 having a plug-in module 400 in accordance with another embodiment of the present invention. Node 300 can include the same forward distribution amplifier, as described with reference to FIG. 1, for processing forward signals in the communication system. However, as shown in FIG. 3, a different plug-in module 400 can be included to change the functionality of the node 300 so that it can be used in an entirely different type of cable television system, e.g., in a hybrid fiber coax system rather than a primarily coax system.

Plug-in module 400, which adds optical functionality to the same forward distribution amplifier within the same environmental housing, includes an optical receiver 305 that is coupled at an optical input 306 of the node 300. The optical receiver 305 converts received forward path optical signals into electrical signals and supplying the electrical signals to the forward gain stages 120. The forward distribution amplifier portion of the node 300 processes the electrical signals in the manner described above to furnish main and auxiliary RF signals at outputs 170, 172, 174.

Plug-in module 400 further includes an optical transmitter 310 for converting reverse path electrical signals into optical signals for transmission at output 340. It will be appreciated that both forward and reverse optical signals could be transmitted at a single port of the node 300, rather than at the illustrated two ports 306, 340. The connection of optical fibers to the optical receiver 305 and transmitter 310 is described in a commonly assigned application entitled "Fiber Routing and Retention Assembly with Modular Fiber Connector Support" (Attorney Docket No. 1263.56284), filed on an even date herewith and incorporated herein by reference.

Plug-in module 400 further includes diplex filters 320, 325. The output of optical receiver 305 is amplified by the forward amplifier circuitry then supplied to the high pass filters 320a, 325a of diplex filters 320, 325. Reverse path signals from the distribution system are supplied to reverse path signal amplifier 315 via the low pass filters 320b, 325b of diplex filters 320, 325, and the amplified reverse path electrical signals, along with any status signal, are supplied to the optical transmitter 310 in the reverse path of the node 300.

It can be seen that, by using plug-in modules 200, 400, it is possible to easily and inexpensively upgrade a forward electrical node in a communications system to include reverse capabilities and/or optical capabilities without having to replace the node itself. The use of a plug-in module 200, 400 to accomplish this upgrade avoids the expense associated with removing all of the electrical components in current node to accomplish an upgrade. This ability is very beneficial as fiber is pushed deeper and deeper in the distribution plant of communications systems.

The upgradeable node according to the present invention is very beneficial for the use of existing cable television systems since a service provider may initially provide a basic forward cable system in which RF signals are distributed via coaxial cables, in which case the node 100 can be provided without any plug-in modules at all. When the demand for reverse signal processing capabilities becomes great enough, the service provider can provide reverse electrical capabilities merely by plugging in a reverse electrical module 200 into the existing node. Then, when capacity of the system has increased to the point that the service provider upgrades to fiber, optical capabilities can be advantageously added by simply removing the reverse electrical module 200 and replacing it with the optical module 400. In conventional systems, on the other hand, the node itself would have to be entirely replaced at each mentioned stage of upgrading the system.

A further advantage of the present invention is that an upgraded fiber node may be provided which has good frequency response flatness performance. In general, broadband amplifiers have certain performances over the operating range of frequencies. This is termed the frequency response of the amplifier. The frequency response is a measure of how each portion of the amplifier bandwidth is amplified in the node. In many cases, it is optimal to have a flat frequency response, in which case all the frequencies (or, in the case of CATV systems, the transmitted channels) exhibit constant gain. The end result is that the levels of the various channels when delivered to the end user are at a constant and consistent level. In accordance with the invention, a fiber receiver design may employ frequency matching components which are stable over temperature and component tolerances.

In addition, the fiber receiver can be tested at an automatic test station where its frequency response can be tuned to be the same as other fiber modules. Since the fiber receiver's frequency response will not vary from unit to unit, the receiver's response can be tailored to the frequency response of the amplifier and thus greater overall flatness can be achieved. Additional details of flatness response are described in a commonly assigned application entitled "Flatness Compensation of Diplex Filter Roll-Off Using Active Amplifier Peaking Circuit" (Attorney Docket No. 1263.56289), filed on an even date herewith and incorporated by reference.

Figure 4:
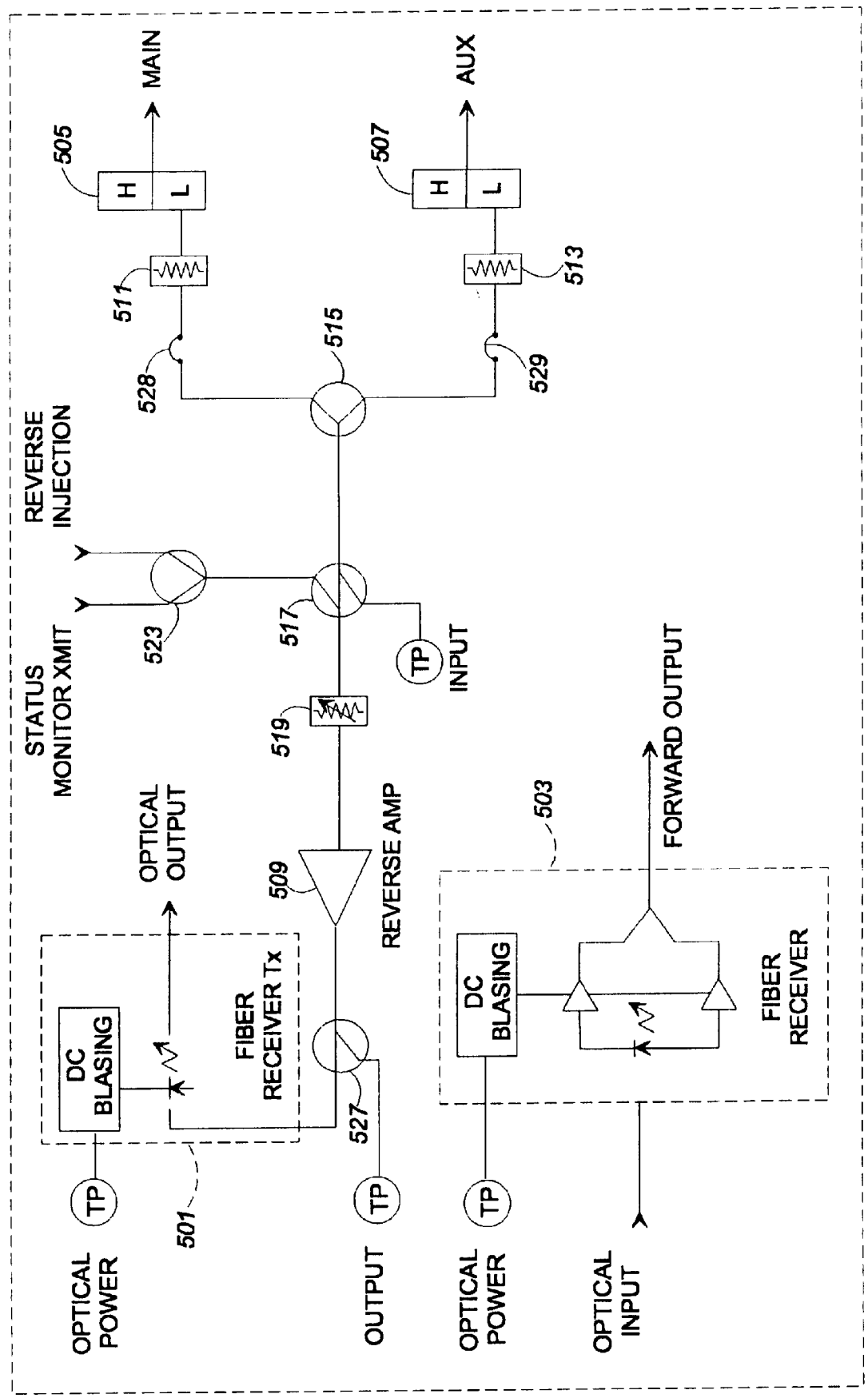
FIGS. 4–8 are block diagrams of plug-in modules usable in the nodes of FIGS. 1 and 3.

FIGS. 4–8 show additional modules which may be used in place of either or both of the modules 200 and 400 of FIGS. 1 and 3, respectively. FIG. 4 is an example of a module which provides a reverse optical transmitter 501 and an optical receiver 503. It is preferable that the power consumption of the optical transmitter and receiver be minimized since it is difficult to heat-sink a plug-in module, and otherwise the temperature of the module due to power dissipation may be too high. The module provides for two reverse inputs from the coaxial distribution plant which are supplied via the low pass filters of diplex filters 505 and 507 to a reverse signal amplifier 509. The module of FIG. 4 may, for example, be used to replace module 200 of FIG. 1 in which case the high pass filters of diplex filters 505 and 507 are supplied with the output of the forward signal amplifiers 140, 145 and the output of optical receiver 503 is supplied to circuit 115. The reverse path signals are supplied from the low pass filters to the reverse signal amplifier via pad circuits 511 and 513, couplers 515 and 517, and an adjustable pad circuit 519. Status monitor information and local reverse signal injection are supplied to reverse path amplifier 509 via couplers 517 and 523. Coupler 517 also serves to couple off a portion of the signal to a test point TP. The output of reverse path amplifier 509 is supplied to optical transmitter 501 via a coupler 527. Coupler 527 couples off a portion of the signal to a test point TP. Jumpers 528 and 529 may be used for connecting/disconnecting the low pass filters of diplex filters 505 and 507 to coupler 515.

Figure 5:
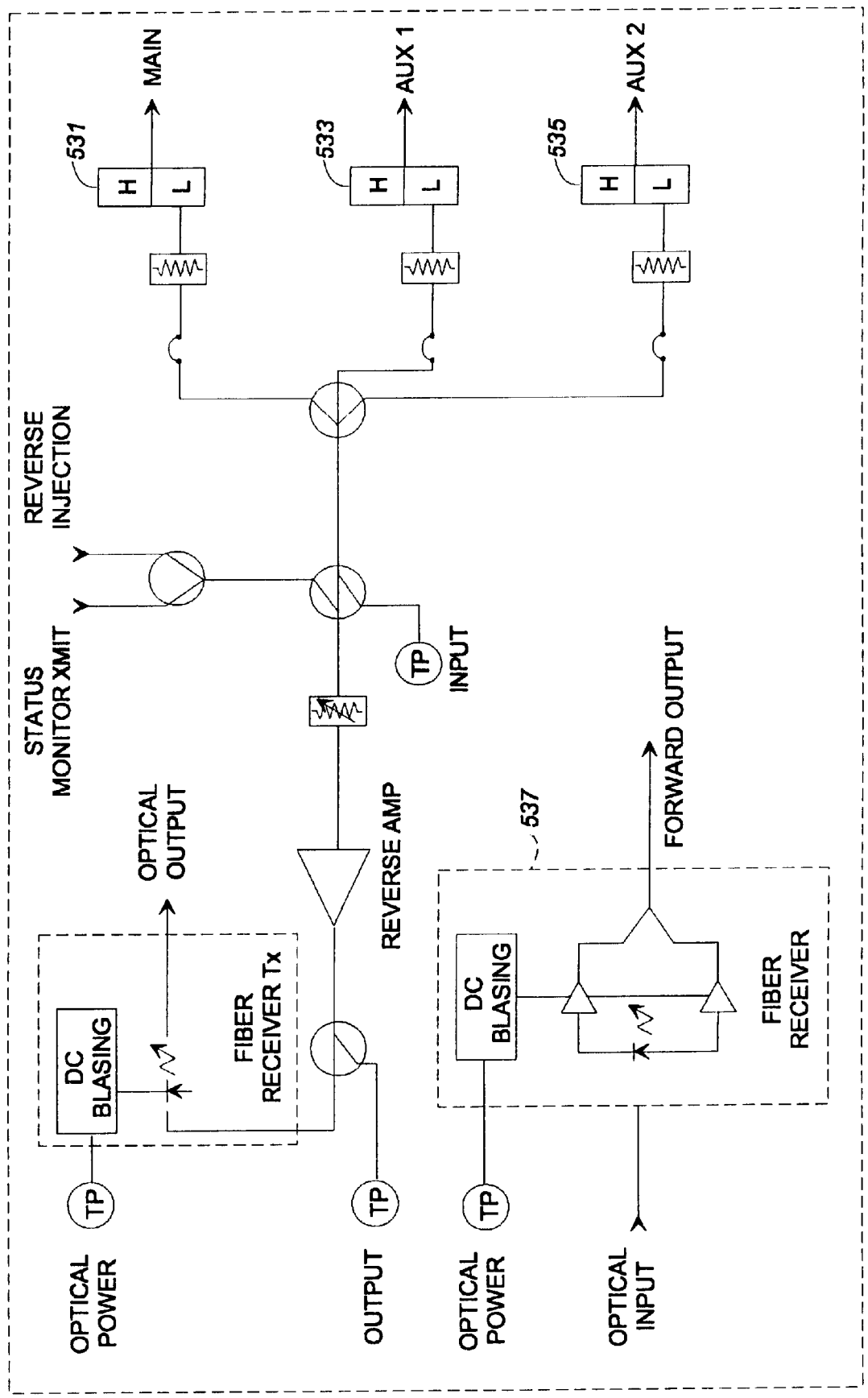

The module of FIG. 5 is similar to the module of FIG. 4, except provision is made for three reverse inputs. The module of FIG. 5 may be used, for example, to replace the module 400 of FIG. 3, in which case the high pass filters of diplex filters 531, 533, and 535 are supplied with the outputs of amplifiers 140, 145, and the forward output of optical receiver 537 is supplied to circuit 115.

Figure 6:
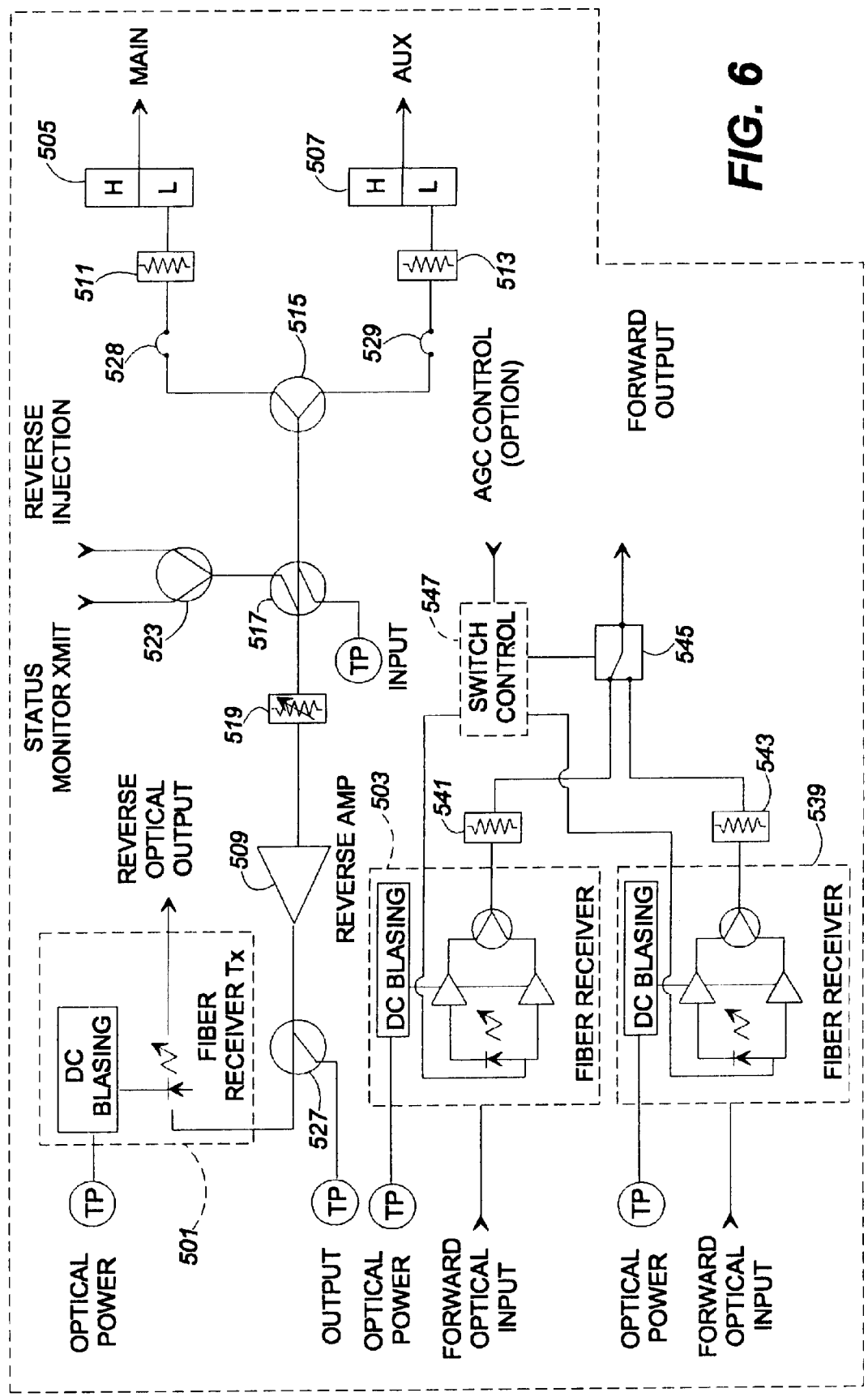

The module of FIG. 6 is similar to module of FIG. 4 and may be used, for example, to replace module 200 of FIG. 1. The module of FIG. 6 further includes a second optical receiver 539, pad circuits 541 and 543, switch 545, and switch control 547. The second optical receiver provides for redundancy in the case of misoperation or malfunction of optical receiver 503. In this case, switch 545 is switched to provide the output of receiver 539 to circuit 115. Switch control 547 may control switch 545 based on a sensed optical input power to the photodiode. For example, if the optical input power of receiver 503 exceeds certain upper and/or lower limits (which may indicate malfunctioning), switch control 547 may control switch 545 to supply the output of optical receiver 539 to circuit 115.

Figure 7:
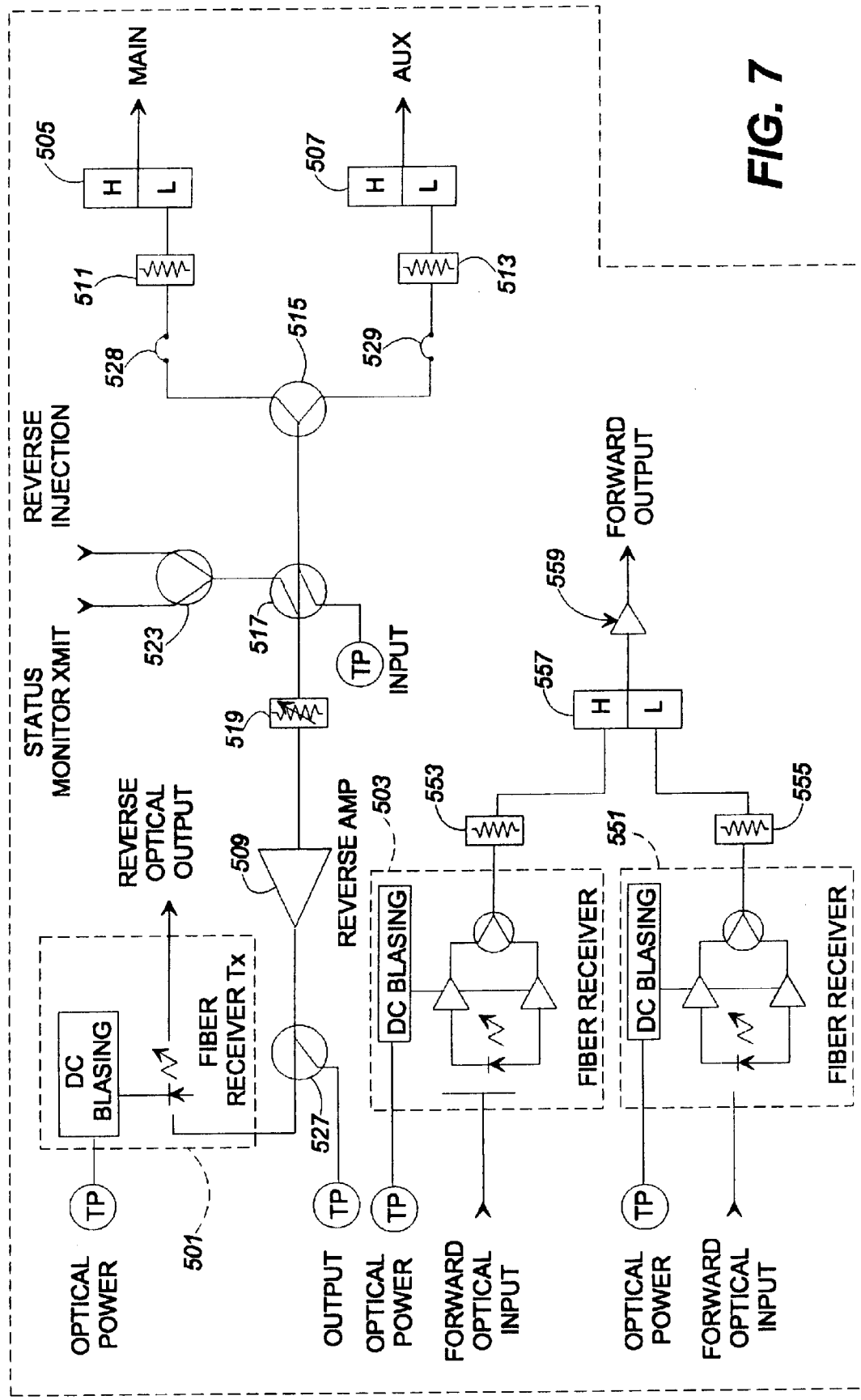

The module of FIG. 7 is similar to module of FIG. 4 and may be used, for example, to replace module 200 of FIG. 1. The module of FIG. 7 further includes a second optical receiver 551, pad circuits 553 and 555, and diplex filter 557. The second optical receiver permits two tiers of optical signals to be supplied to the node. The high pass and low pass filter outputs of diplex filter 557 are supplied to circuit 115 via an amplifier 559. Amplifier 559 boosts the signal which has been attenuated through the pads and the diplex filter.

Figure 8:
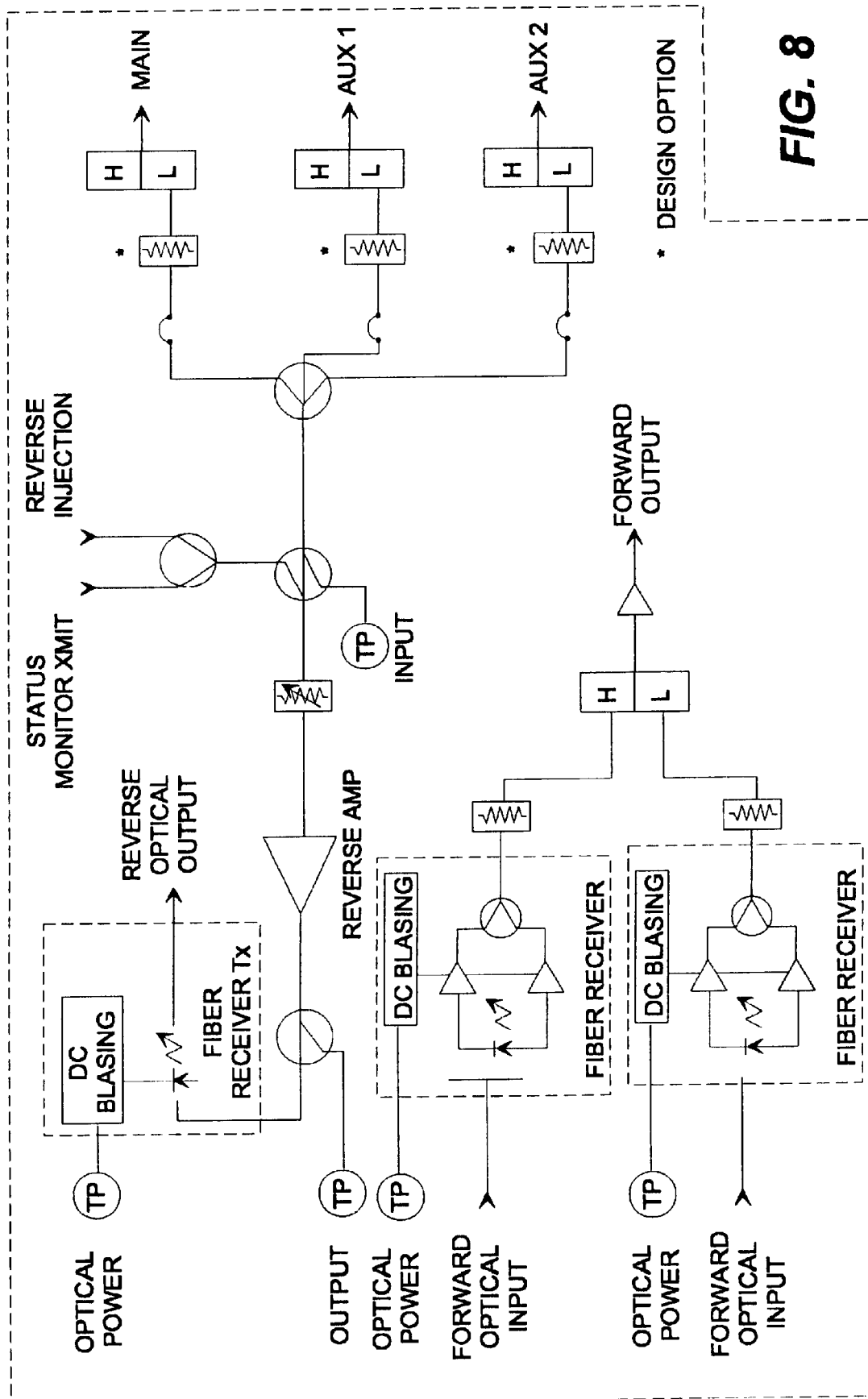

The module of FIG. 8 is similar to the module of FIG. 7, but provides for three reverse inputs and may be used to replace module 400 of FIG. 3.

Figure 9A:
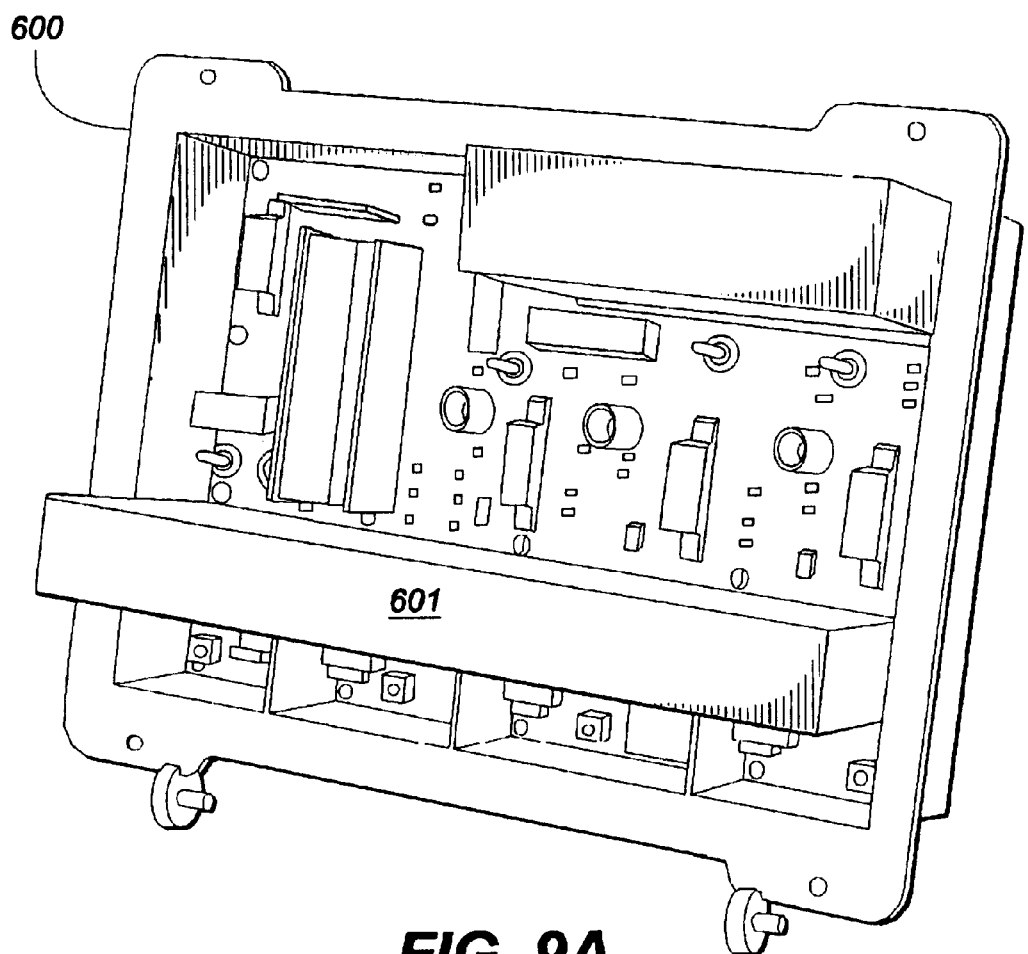
FIGS. 9A–9C illustrate a housing for containing a motherboard and a plug-in module.
Figure 9B:
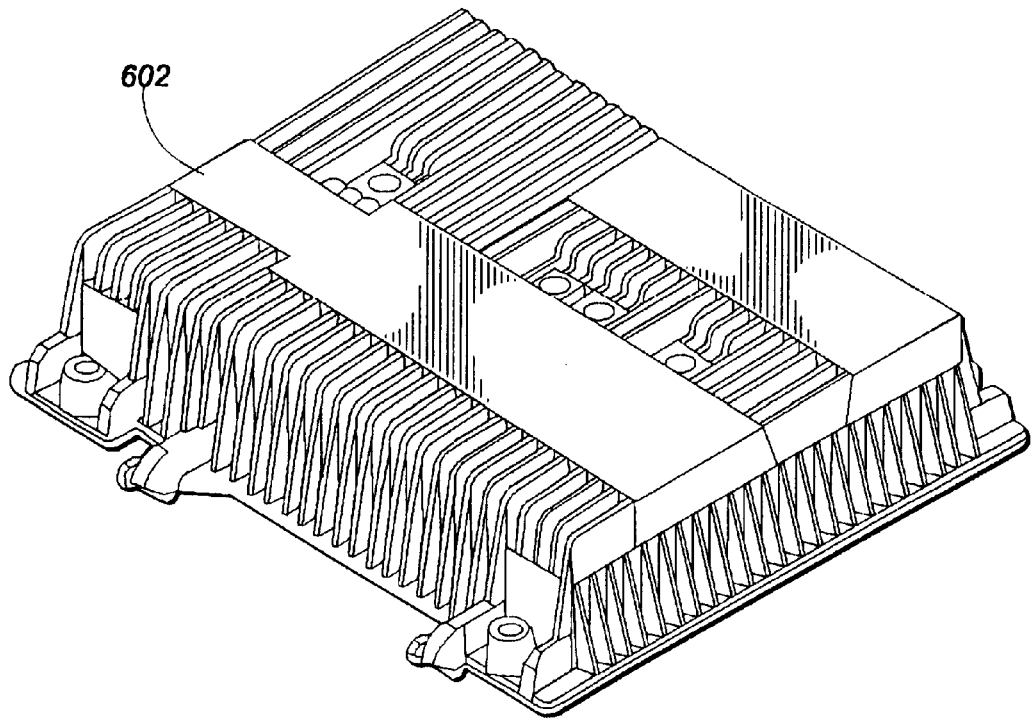
Figure 9C:
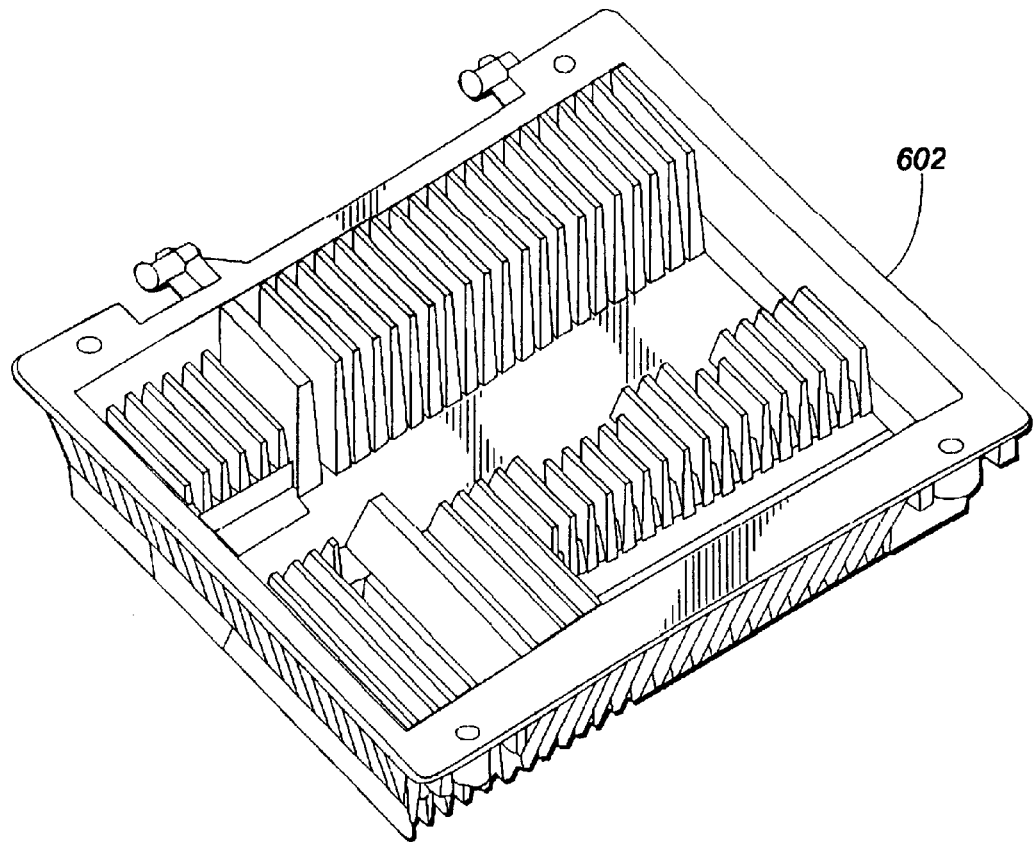

FIG. 9A illustrates a node housing portion 600 which includes a plug-in module 601 connected to the motherboard. FIGS. 9B and 9C illustrate a housing cover 602 which, together with node housing portion 600, protects the circuit boards from environmental elements such as dirt, rain, snow, etc. The details of a housing suitable for a node of the present invention are described in a commonly assigned application entitled "Housing for Electronic Devices Including Internal Fins for Volumetric Cooling" (Attorney Docket No. 1263.56282), filed on an even date herewith and incorporated by reference.

While there has been shown and described the preferred embodiments of the invention, it will be evident to those skilled in the art that various modifications may be made thereto without departing from the spirit and scope of the invention as set forth in the appended claims.

We claim:

1. A node for a communications system that provides communications in at least a forward direction, the node comprising:

an electrical input for receiving an forward electrical signal;

an electrical output for providing an amplified forward electrical signal;

an amplifier circuit coupled between the electrical input and the electrical output for amplifying the forward electrical signal to generate the amplified forward electrical signal;

a housing for enclosing the amplifier circuit and through which the electrical input and the electrical output are accessible;

a reverse amplifier module removably mounted to the amplifier circuit for providing, when mounted to the amplifier circuit, reverse amplification of a reverse electrical signal transmitted via the communications system, wherein the reverse amplifier module is coupled between the electrical input and the electrical output to receive the reverse electrical signal via the electrical output and to provide an amplified reverse electrical signal via the electrical input, and wherein the reverse amplifier module is included within the housing for enclosing the amplifier circuit, wherein the node is configured to receive an optical module as a removable replacement for the reverse amplifier module and wherein, when the optical module is mounted to the amplifier circuit, the node processes reverse optical signals instead of reverse electrical signals, and, when neither the reverse amplifier module nor the optical module is mounted to the amplifier circuit the node operates to process only forward electrical signals.

2. The node of claim 1, further comprising:

a first circuit board including the amplifier circuit; and a second circuit board including the reverse amplifier module, wherein the second circuit board removably plugs into the first circuit board when reverse amplification is to be provided by the node.

3. The node of claim 1, further comprising:

a first mechanical connector that is coupled to the electrical input and that is accessible from an exterior of the housing; and a second mechanical connector that is coupled to the electrical output and that is accessible from the exterior of the housing.

4. The node of claim 3, wherein the first and second mechanical connectors couple to coaxial cables that are included in the communications system.

5. The node of claim 1, further comprising:

an optical module removably mounted to the amplifier circuit for replacing the reverse amplifier module, the optical module for providing, when mounted to the amplifier circuit, optical processing of signals within the communications system and the node, wherein, when the optical module is mounted to the amplifier circuit, the amplifier circuit is physically disconnected from the electrical input.

6. The node of claim 5, wherein the optical module comprises:

an optical input for receiving a forward optical signal; and an optical receiver coupled to the optical input for converting the forward optical signal to the forward electrical signal, wherein the optical receiver is coupled to the amplifier circuit to provide the forward electrical signal thereto for amplification by the amplifier circuit.

7. The node of claim 6, wherein, when reverse signals are transmitted in the communications system, the optical module further comprises:

an optical transmitter coupled to the electrical output for receiving therefrom a reverse electrical signal and converting the reverse electrical signal to a reverse optical signal; and an optical output for providing the reverse optical signal.

8. A node for a communications system that provides communications in at least a forward direction, the node comprising:

an input for receiving a forward signal;

an electrical output for providing an amplified forward electrical signal;

an amplifier circuit coupled between the input and the electrical output for amplifying a forward electrical signal to generate the amplified forward electrical signal;

one of a reverse amplifier module and an optical module, the reverse amplifier module removably mounted to the amplifier circuit when reverse electrical signals are to be provided within the communications system, and the optical module removably mounted to the amplifier circuit when optical signals are to be provided within the communications system, wherein, when the reverse amplifier module is removably mounted to the amplifier circuit, the forward signal comprises the forward electrical signal, the amplifier circuit is coupled to the input and receives the forward electrical signal, and the reverse amplifier module provides reverse amplification of a reverse electrical signal transmitted via the communications system, wherein the reverse amplifier module is coupled between the input and the electrical output to receive the reverse electrical signal via the electrical output and to provide an amplified reverse electrical signal via the input, and wherein, when the optical module is removably mounted to the amplifier circuit, the forward signal comprises a forward optical signal, the amplifier circuit is disconnected from the input, and the optical module is coupled to the input and receives the forward optical signal, wherein the optical module comprises an optical receiver for converting the forward optical signal to the forward electrical signal that is processed by the amplifier circuit; and a housing for enclosing both the amplifier circuit and the one of the reverse amplifier module and the optical module.

9. The node of claim 8, wherein the optical module further comprises:

an optical transmitter coupled to the electrical output for receiving therefrom a reverse electrical signal and converting the reverse electrical signal to a reverse optical signal; and an optical output for providing the reverse optical output.

10. The node of claim 8, further comprising:

a first circuit board including the amplifier circuit; and a second circuit board including the reverse amplifier module.

11. The node of claim 8, further comprising:

a first circuit board including the amplifier circuit; and a second circuit board including the optical module.

12. The node of claim 11, further comprising:

a first mechanical connector that is coupled to the input and that is accessible from an exterior of the housing; and a second mechanical connector that is coupled to the electrical output and that is accessible from the exterior of the housing.

13. A cable television system for providing communications in forward and reverse directions, the cable television system comprising:

a node having an input and an output for processing forward and reverse signals, the node comprising:

an amplifier circuit for amplifying a forward electrical signal to generate an amplified forward signal at the output of the node;

a housing for enclosing the amplifier circuit; and one of a reverse amplifier module and an optical module removably mounted within the housing and to the amplifier circuit for providing, respectively, one of a reverse electrical functionality and an optical functionality;

a first communication medium coupled to the input; and a second communication medium coupled to the output, wherein the node processes reverse electrical signals when the reverse amplifier module is mounted within the housing, wherein the node processes reverse optical signals, instead of reverse electrical signals, when the optical module, instead of the reverse amplifier module, is mounted within the housing, and wherein, when neither the reverse amplifier module nor the optical module is mounted to the amplifier circuit, the node operates to process only forward electrical signals.

14. The cable television system of claim 13, wherein, when the reverse amplifier module is removably mounted to the amplifier circuit, the amplifier circuit is coupled to the input for receiving the forward electrical signal therefrom, and the reverse amplifier module is coupled between the input and the output for receiving a reverse electrical signal via the output and amplifying the reverse electrical signal to provide an amplified reverse electrical signal at the input.

15. The cable television system of claim 14, further comprising:

a headend for generating the forward signals; and subscriber equipment for generating the reverse signals, wherein:

the first communication medium comprises coaxial cable for transmitting the forward electrical signal from the headend to the node and for transmitting the amplified reverse electrical signal from the node to the headend; and the second communication medium comprises coaxial cable for transmitting the amplified forward electrical signal from the node to the subscriber equipment and for transmitting the reverse electrical signal from the subscriber equipment to the node.

16. The cable television system of claim 13, wherein, when the optical module is removably mounted to the amplifier circuit, the amplifier circuit is decoupled from the input, and wherein the optical module comprises:

an optical receiver coupled to the input for receiving therefrom a forward optical signal and for converting the forward optical signal to the forward electrical signal for processing by the amplifier circuit to which it is coupled.

17. The cable television system of claim 16, further comprising:

a headend for generating the forward signals, wherein:

the first communication medium comprises fiber optic cable for transmitting the forward optical signal from the headend to the node; and the second communication medium comprises coaxial cable for transmitting the amplified forward electrical signal from the node to the subscriber equipment.

18. The cable television system of claim 13, wherein, when the optical module is removably mounted to the amplifier circuit, the amplifier circuit is decoupled from the input, and wherein the optical module comprises:

an optical receiver coupled to the input for receiving therefrom a forward optical signal and for converting the forward optical signal to the forward electrical signal for processing by the amplifier circuit to which it is coupled; and an optical transmitter coupled between the input and the output for receiving from the output a reverse electrical signal, converting the reverse electrical signal to a reverse optical signal, and providing the reverse optical signal at the output of the node.

19. The cable television system of claim 18, further comprising:

a headend for generating the forward signals; and subscriber equipment for generating the reverse signals, wherein:

the first communication medium comprises fiber optic cable for transmitting the forward optical signal from the headend to the node and for transmitting the reverse optical signal from the node to the headend; and the second communication medium comprises coaxial cable for transmitting the amplified forward electrical signal from the node to the subscriber equipment and for transmitting the reverse electrical signal from the subscriber equipment to the node.

* * * * *